US005363070A

United States Patent [19]

Arimoto

[11] Patent Number: 5,363,070
[45] Date of Patent: Nov. 8, 1994

[54] ATTENUATOR HAVING PHASE BETWEEN INPUT AND OUTPUT SIGNALS INDEPENDENT OF ATTENUATION

[75] Inventor: Masao Arimoto, Itami, Japan

[73] Assignee: Mitsubishi Denki Kabushiki Kaisha, Tokyo, Japan

[21] Appl. No.: 162,900

[22] Filed: Dec. 8, 1993

[30] Foreign Application Priority Data

Dec. 9, 1992 [JP] Japan .................. 4-352718

[51] Int. Cl.$^5$ .................. H03H 7/24; H03H 7/48
[52] U.S. Cl. ..............................: 333/100; 333/130; 333/81 R; 323/353; 323/354
[58] Field of Search ............... 333/100, 101, 103, 105, 333/130, 81 R; 323/353, 354

[56] References Cited

U.S. PATENT DOCUMENTS 3,453,529  7/1969  Richman ..................... 333/81 R
4,912,394  3/1990  Sugimoto et al. ............ 333/81 R X

FOREIGN PATENT DOCUMENTS 1318307  12/1989  Japan .
247909   2/1990   Japan .
4116425  10/1992  Japan .

*Primary Examiner*—Paul Gensler
*Attorney, Agent, or Firm*—Leydig, Voit & Mayer

[57] ABSTRACT

An attenuator includes first resistors that are connected in series to each other at connection nodes and between an input node and a fixed voltage node, voltage output nodes coupled to the input node and the respective connection nodes of the first resistors, switches and corresponding second resistors being respectively connected in series between the connection nodes and voltage output nodes and commonly connected to an output node, and a load capacitance connected between an output node and the fixed voltage node. The phase between input and output signals is independent of the attenuation. A phase difference is added by the second resistor so that the phase shift determined by the voltage dividing ratio of the first resistors selected by closing a switch and by the value of the load capacitance is compensated.

6 Claims, 5 Drawing Sheets

ATTENUATOR HAVING PHASE BETWEEN INPUT AND OUTPUT SIGNALS INDEPENDENT OF ATTENUATION

FIELD OF THE INVENTION

The present invention relates to an attenuator and, more particularly, to a voltage dividing type attenuator attenuating a reference voltage signal with a reference step.

BACKGROUND OF THE INVENTION

FIGS. 3(a) and 3(b) show a circuit construction of a prior art attenuator and its input and output waveforms. FIG. 3(a) is circuit diagram of the attenuator, and FIG. 3(b) is a diagram illustrating the output waveforms against its input signal. In FIG. 3(a), a signal applied to an input terminal $V_{IN}$ is divided by a dividing circuit of resistors $R_{01}$, $R_{12}$, $R_{23}$, $R_{34}$, $R_{45}$ and $R_{5G}$ which are serially connected to each other between the input terminal $V_{IN}$ and the ground. This divided signal is obtained from an output terminal $V_{OUT}$ by turning on one of the switches of a switch $SW_0$ connected between the input terminal $V_{IN}$ and the output terminal $V_{OUT}$, a switch $SW_1$ connected between the resistors $R_{01}$ and $R_{12}$ at its one end and connected to the output terminal $V_{OUT}$ at the other end, a switch $SW_2$ connected between the resistors $R_{12}$ and $R_{23}$ at its one end and connected to the output terminal $V_{OUT}$ at the other end, a switch $SW_3$ connected between the resistors $R_{23}$ and $R_{34}$ at its one end and connected to the output terminal $V_{OUT}$ at the other end, a switch $SW_4$ connected between the resistors $R_{34}$ and $R_{45}$ at its one end and connected to the output terminal $V_{OUT}$ at the other end, and a switch $SW_5$ connected between the resistors $R_{45}$ and $R_{5G}$ at its one end and connected to the output terminal $V_{OUT}$ at the other end. Reference character C designates a load capacitance between the output terminal $V_{OUT}$ and the ground potential.

A description is given of the operation.

Suppose that a signal $V_i$ input to the input terminal $V_{IN}$ is a sinusoidal wave of angular frequency $\omega$ and wave height, i.e., amplitude, $V_0$. This signal $V_i$ is divided by the serially connected resistors $R_{01}$, $R_{12}$, $R_{23}$, $R_{34}$, $R_{45}$ and $R_{5G}$, and for example, the divided voltage $V_1$ appearing at a node between the resistors $R_{12}$ and $R_{23}$ of a wave height $V_1$ is represented by the following formula (1):

$$V_1 = \frac{R_{23} + R_{34} + R_{45} + R_{5G}}{R_{01} + R_{12} + R_{23} + R_{34} + R_{45} + R_{5G}} \cdot V_0 \quad (1)$$

Thereupon, when only the switch $SW_2$ is turned on, an output signal $V_o$ of wave height $V_1$ shown in the formula (1) is output to the output terminal $V_{OUT}$.

Similarly, the divided voltage $V_2$ appearing at a node between the resistors $R_{45}$ and $R_{5G}$ of a wave height $V_2$ is represented by the following formula (2):

$$V_2 = \frac{R_{5G}}{R_{01} + R_{12} + R_{23} + R_{34} + R_{45} + R_{5G}} \cdot V_0 \quad (2)$$

Thereupon, when only the switch $SW_5$ is turned on in place of the switch $SW_2$, the output signal $V_0$ of the wave height $V_2$ as shown in the formula (2) is output to the output terminal $V_{OUT}$ with its angular frequency $\omega_0$.

When the wave height of the input signal is $V_0$, the angular frequency thereof is $\omega$, and the phase delay thereof is $\omega \cdot t_0$, the input signal $V_i$ is represented by the following formula (3):

$$V_i = V_0 \cdot \sin \omega(t - t_0) \quad (3)$$

And when the wave height of the output signal is $V_m$, the angular frequency thereof is $\omega$, and the phase delay thereof is $\omega \cdot t_d$, the input signal $V_o$ is represented by the following formula (4):

$$V_0 = V_m \cdot \sin \omega(t - t_d) \quad (4)$$

FIG. 3(b) shows waveforms of the input signal $V_i$ and the output signal $V_o$. In the output waveform, when only the switch $SW_2$ is turned on, the wave height $V_m$ becomes $V_1$ given by the formula (1), and the delay time $t_d$ becomes $(t_0 + t_1)$, and the formula (4) becomes the following formula (5):

$$V_0(SW_2) = V_1 \cdot \sin \omega(t - t_0 - t_1) \quad (5)$$

In addition, when only the switch $SW_5$ is turned on, the wave height $V_m$ becomes $V_2$ as given by the formula (2), and the delay time $t_d$ becomes $(t_0 + t_2)$, and the formula (5) becomes the following formula (6):

$$V_0(SW_5) = V_2 \cdot \sin \omega(t - t_0 - t_2) \quad (6)$$

The prior art attenuator is constructed as described above, and there arises a deviation in phase dependent on the degree of attenuation, and also it was difficult to control the phase of the output signal so as to compensate the deviation in phase.

SUMMARY OF THE INVENTION

It is an object of the present invention to provide an attenuator keeping the phase difference between the input signal and the output signal constant independent of the attenuated quantity.

Other objects and advantages of the present invention will become apparent from the detailed description given hereinafter; it should be understood, however, that the detailed description and specific embodiment are given by way of illustration only, since various changes and modifications within the scope of the invention will become apparent to those skilled in the art from this detailed description.

According to a first aspect of the present invention, an attenuator includes a plurality of first resistors that are connected in series to each other between an input node to which an input signal to be attenuated is applied and a predetermined voltage node. A plurality of voltage output nodes are connected to the input node and the connection nodes of adjacent first resistors. A plurality of switches, only one of which is selectively closed at a time, are respectively connected to the plurality of voltage output nodes, one end of each of a plurality of second resistors is connected to an output terminal of a corresponding switch of the plurality of switches and the other ends of the second resistors are commonly connected to provide an output node for outputting an attenuated output signal. A load capacitance is connected between the output node and the predetermined voltage node. By this construction, the phase difference that arises in accordance with the attenuation quantity, a phase amount that is determined dependent on the phase difference is added by the second resistor. The resistance of the second resistor is determined so that the phase shift amount of the output signal against the input signal, determined by the voltage dividing ratio of the first resistors and the capacitance value of the load capacitance, does not depend on the attenuation quantity, that is, in accordance with the selected switch, whereby even when any attenuation quantity is selected, an attenuated output of a constant phase difference can be easily obtained without deteriorating the precision of the voltage division for the attenuation.

According to a second aspect of the present invention, an attenuator includes a plurality of first resistors that are connected in series to each other between an input node to which an input signal to be attenuated is input and a predetermined voltage node. A plurality of voltage output nodes are connected to the input node and respective ones of a plurality of connection nodes between adjacent first resistors, one end of each of a plurality of second resistors is connected a corresponding one of the plurality of voltage output nodes, respectively, the plurality of output nodes outputting attenuated output signals to the other ends of the plurality of second resistors, respectively. A plurality of load capacitances are connected between the plurality of output nodes and the predetermined voltage node, respectively. By this construction, to the phase difference that arises in accordance with the attenuation, a required phase amount that is dependent on the phase difference is added by the second resistor. The resistance of the second resistor is determined so that the phase shift of the output signal against the input signal, is determined by the voltage dividing ratio of the first resistors and the capacitance value of the load capacitance, and does not depend on the attenuation quantity, i.e., on the output node, whereby a plurality of attenuated outputs having a constant phase difference can be obtained at the same time easily and without deteriorating the precision of the voltage division for the attenuation.

According to a third aspect of the present invention, in an attenuator, the resistance values of the second resistors are selectable using the plurality of resistors and switches and, therefore, the phase difference between the input and the output can be can finely adjusted by positively varying the phase difference between the input and the output to some degree.

DETAILED DESCRIPTION OF THE PREFERRED EMBODIMENTS

Figure 1:
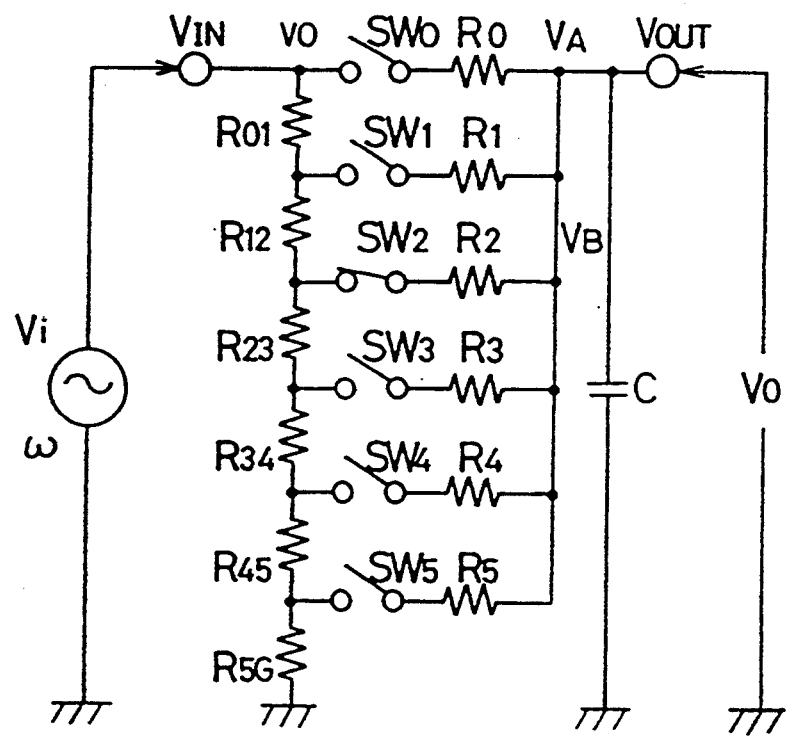
FIG. 1(a) is a circuit diagram illustrating an attenuator according to a first embodiment of the present invention.
FIG. 1(b) is a diagram showing the input and output waveforms thereof.
Figure 1:
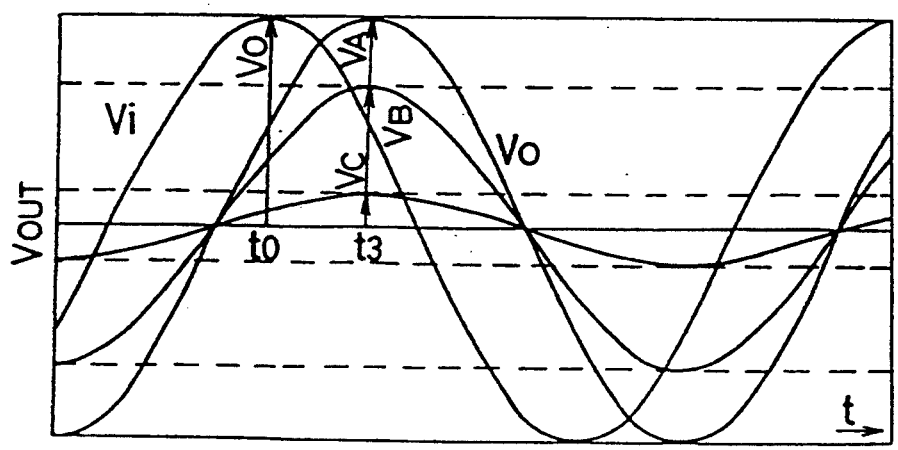

Embodiment 1.

FIG. 1(a) is a circuit diagram illustrating an attenuator according to a first embodiment of the present invention, and FIG. 1(b) shows the input and output waveforms.

In FIG. 1(a), a signal applied to an input terminal $V_{IN}$ is divided by six resistors $R_{01}$, $R_{12}$, $R_{23}$, $R_{34}$, $R_{45}$, and $R_{5G}$ connected in series to each other between the input terminal $V_{IN}$ and the ground. One end of the switch $SW_0$ is connected to the input terminal $V_{IN}$ and one end of the switches $SW_1$, $SW_2$, $SW_3$, $SW_4$, and $SW_5$ is respectively connected to a connection node of two adjacent resistors, and the other ends of the six switches are commonly connected to one output terminal $V_{OUT}$, respectively through resistors $R_0$, $R_1$, $R_2$, $R_3$, $R_4$, and $R_5$. It is supposed that these six resistors $R_0$, $R_1$, $R_2$, $R_3$, $R_4$, and $R_5$ produce respective phase differences of $\theta_0$, $\theta_1$, $\theta_2$, $\theta_3$, $\theta_4$, and $\theta_5$ in the divided input signal at the respective connection nodes of the resistors $R_{01}$, $R_{12}$, $R_{23}$, $R_{34}$, $R_{45}$, and $R_{5G}$ and the six switches $SW_0$, $SW_1$, $SW_2$, $SW_3$, $SW_4$, and $SW_5$, respectively.

Then, suppose that the phase difference between the output and the input is $\theta_{out}$, if the resistance values of the respective resistors $R_n (n=1-5)$ are set so that a phase shift that is determined by the phase difference may be applied to the phase difference that arises dependent on the attenuation quantity so as to produce a constant phase difference when any switch is selected, the phase difference between the input and output becomes constant even when any switch is thus selected. In order to realize this, the resistance values to be possessed by the respective resistors $R_n (n=1-5)$ are given by the following formula (7), $$R_n = \frac{\tan(\theta_n - \theta_{out})}{\omega C} \tag{7}$$

value is ascertained by inputting a signal similar to the signal that is to be input. In the formula (7), reference character C represents a load capacitance of the output signal.

Therefore, when only the switch $SW_0$ is closed, an output wave $V_0$ of wave height $V_A$, and phase delay $\omega(t_0+t_3)$ is obtained. In addition, when only the switch $SW_2$ is closed, an output of wave height $V_B$ and phase delay $\omega(t_0+t_3)$ is obtained, and when only the switch $SW_5$ is closed, an output of wave height $V_C$ and phase delay $\omega(t_0+t_3)$ is obtained. These outputs are represented by the following formula (8), (9), (10):

$$V_0(SW_0) = V_A \cdot \sin \omega(t-t_0-t_3) \tag{8}$$

$$V_0(SW_2) = V_B \cdot \sin \omega(t-t_0-t_3) \tag{9}$$

$$V_0(SW_5) = V_C \cdot \sin \omega(t-t_0-t_3) \tag{10}$$

Here, $$V_A = V_0 \tag{11}$$

$$V_B = V_1 \tag{12}$$

$$V_C = V_2 \quad (13)$$

$$\theta t_3 = \theta_{out} \quad (14)$$

In this first embodiment, because the resistance values of the respective resistors connected in series to the plurality of switches are chosen based upon the phase difference added to the phase difference that arises dependent on the attenuation quantity, even when any switch is closed, the phase difference between the signal that is obtained from the output terminal and the signal that is input to the input terminal is constant. Even when any output signal having any attenuation quantity is selected, the phase difference between the input and the output signals can be made constant, regardless of the attenuation quantity.

The above-described formula (7) can be derived as described above.

The output signal $V_o$, when a resistor R is serially inserted to the input signal $V_i$ at an angular frequency $\omega$ and with a phase delay $\theta_i$, is represented by the following formula:

$$V_0 = V_i \cdot \frac{\frac{1}{j\omega C}}{R + \frac{1}{j\omega C}} = V_i \cdot \frac{1}{1 + j\omega CR}$$

Therefore, $$V_0/V_i = (1 - j\omega CR)/\{1 + (\omega CR)^2\} \quad (15)$$

Therefore, the phase delay $\theta_0$ of the signal $V_o v$ becomes:

$$\theta_0 = \tan^{-1} \frac{\frac{-\omega CR}{1 + (\omega CR)^2}}{\frac{1}{1 + (\omega CR)^2}} + \theta_i = -\tan^{-1} \omega CR + \theta_i$$

Therefore, the phase difference $(\theta_0 - \theta_i)$ becomes, $$\theta_0 - \theta_i = -\tan^{-1} \omega CR \quad (16)$$

Figure 7:
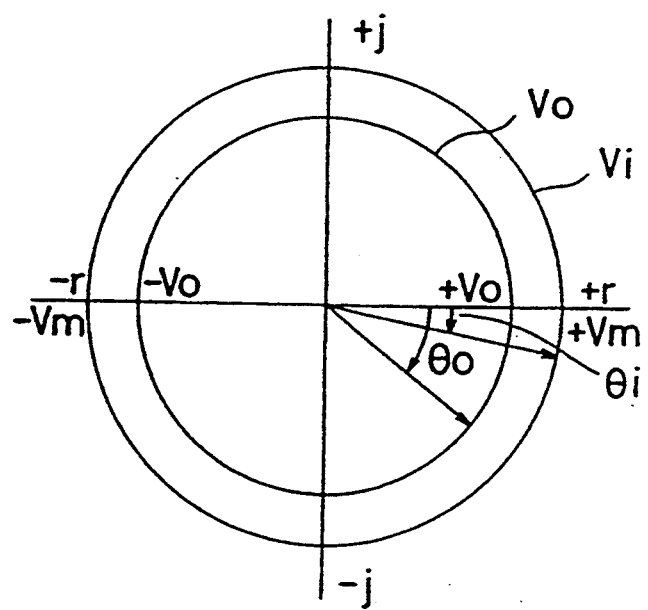
FIG. 7 is a diagram illustrating a vector diagram that is employed when the formula (7) is applied.

This is represented by vector representation as shown in FIG. 7.

Therefore, the general formula of $v_i$, $v_o$ become as in the following formula:

$$V_i = V_0 \cdot \sin(\omega t - \theta_i) \quad (17)$$

$$V_0 = V_m \cdot \sin(\omega t - \theta_0) \quad (18)$$

When the phase difference of formula (16) is made as $\theta_1$, the formula (18) becomes:

$$V_0 = V_m \cdot \sin(\omega t - \theta_0 - \theta_1) \quad (19)$$

Figure 6:
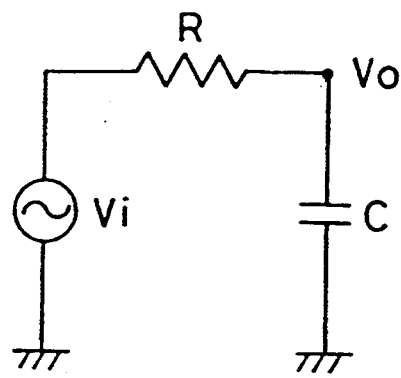
FIG. 6 is a diagram illustrating an equivalent circuit that is employed when the formula (7) is applied

From the above, by the circuit of FIG. 6 in which one resistor R is inserted in series to the input signal $v_i$, the output signal can be delayed with relative to the input signal by an amount of $\theta_1 (= \theta_0 - \theta_i)$ represented by the formula (16).

In other words, the value of the resistance R that can delay the output signal relative to the input signal by $\theta 1$ in FIG. 6 is obtained from the formula (16), as:

$$R = \frac{\tan(\theta_i - \theta_0)}{\omega C} \quad (20)$$

The above-described formula (7) can be derived in this way. In addition, the formulae (8), (9), and (10) can be obtained respectively by making the phase delay that of $\omega(t_0 - t_3)$ by inserting a resistor having a value obtained from the formula (7).

While in this first embodiment there are six switches $SW_0$, $SW_1$, $SW_2$, $SW_3$, $SW_4$, and $SW_5$ and resistors $R_1$, $R_2$, $R_3$, $R_4$, and $R_5$ there may be any number equal to the number of the resistors connected between the input terminal and ground, and the same effects are also obtained as in the first embodiment.

Embodiment 2.

While in the first embodiment an attenuation output having a constant phase difference is obtained by employing a plurality of switches, it is also possible to provide a construction in which various attenuated outputs are output with a constant phase difference between the input signal and the output signal, by removing these switches from the first embodiment.

Figure 2:
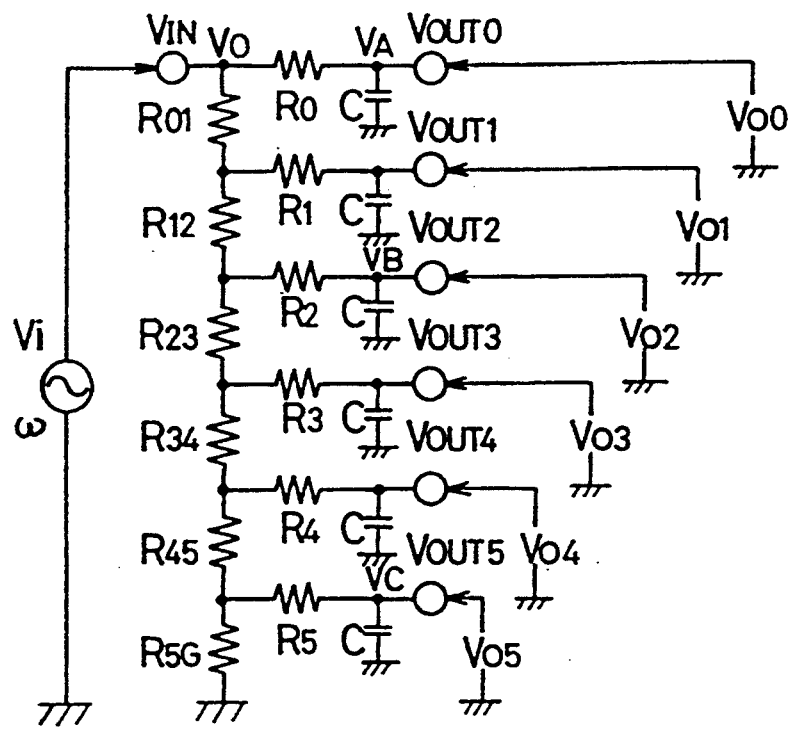
FIG. 2(a) is a circuit diagram illustrating an attenuator having multiple outputs according to a second embodiment of the present invention.
FIG. 2(b) is a diagram showing the input and output waveforms thereof.
Figure 2:
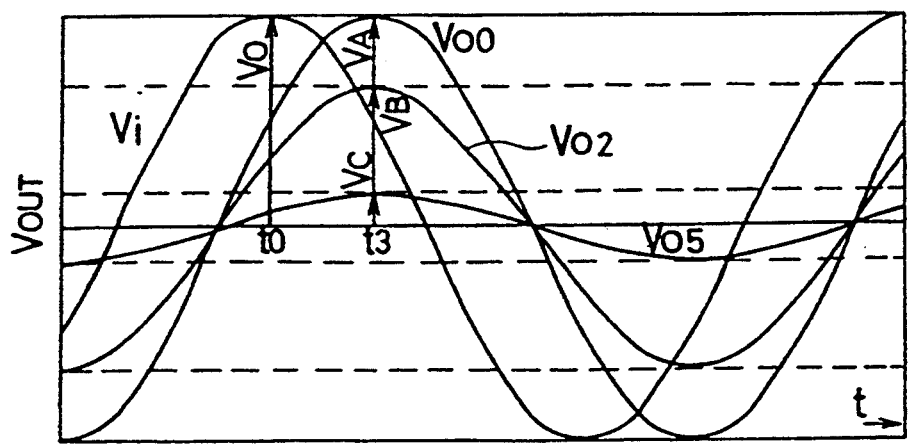
Figure 3:
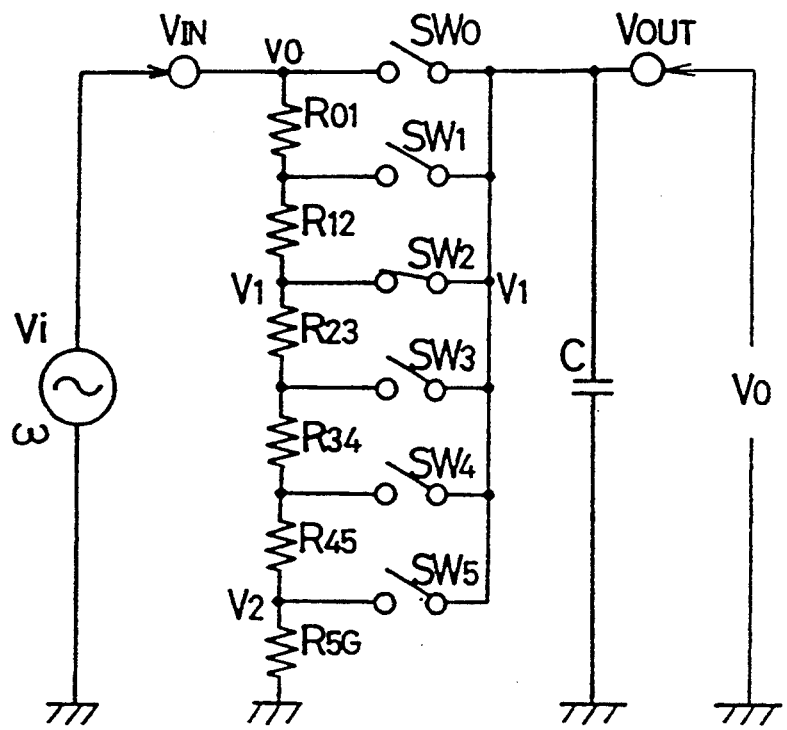
FIG. 3(a) is a circuit diagram illustrating an attenuator according to a prior art.
FIG. 3(b) is a diagram showing the input and output waveforms thereof.
Figure 3:
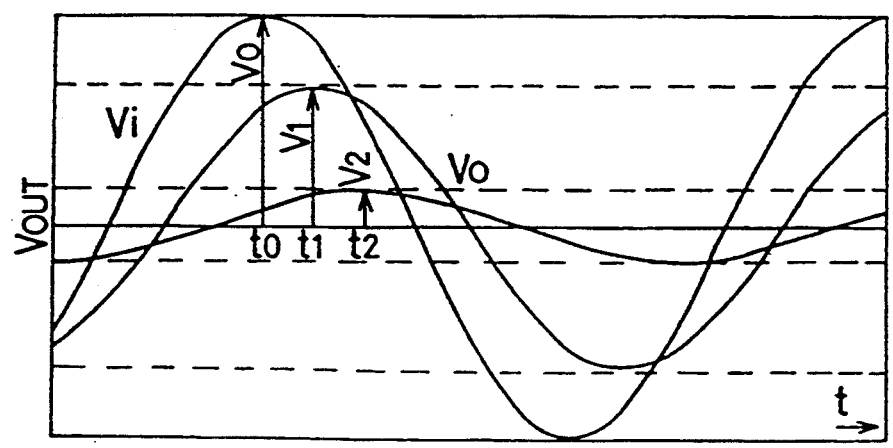

FIG. 2(a) shows a circuit diagram of an attenuator according to a second embodiment of the present invention that has such a construction, and FIG. 2(b) shows three output waveforms among six outputs together with the input waveform.

In FIG. 2(a), the signal input to the input terminal $V_{IN}$ is divided by the six resistors $R_{01}$, $R_{12}$, $R_{23}$, $R_{34}$, $R_{45}$, and $R_{5G}$ which are connected in series between the input terminal $V_{IN}$ and the ground. Then, the divided signal is respectively output to six output terminals $V_{out0}$, $V_{out1}$, $V_{out2}$, $V_{out3}$, $V_{out4}$, and $V_{out5}$, respectively, via six resistors $R_0$, $R_1$, $R_2$, $R_3$, $R_4$, and $R_5$, respectively. One end of resistor $R_o$ is connected to the input terminal $V_{IN}$ and the resistors $R_1$, $R_2$, $R_3$, $R_4$, and $R_5$ are respectively connected to the five connection nodes of the adjacent resistors $R_{01}$, $R_{12}$, $R_{23}$, $R_{34}$, $R_{45}$, and $R_{5G}$.

Here, the resistance values of the resistors $R_n(n=1-5)$ are given by the formula (7) similarly as in the first embodiment.

Therefore, from the terminal $V_{out0}$, an output waveform $V_o$ of wave height $V_A$ and phase delay $\omega(t_0 + t_3)$ is obtained. In addition, an output of wave height $V_B$ and phase delay $\omega(t_0 + t_3)$ and an output of wave height $V_C$ and phase delay $\omega(t_0 + t_3)$ are obtained from the output terminal $V_{out3}$ and from the output terminal $V_{out5}$ respectively at the same time. These are given by the formulae (8), (9), and (10), respectively.

In this way, according to this second embodiment, because the resistance values of the resistors provided between the connection nodes of the voltage dividing resistors and the output terminals are set to values that add a required phase value dependent on the phase difference that depends on the attenuation quantity, the signals that are obtained from any output terminal have a constant phase difference relative to the signal input to the input terminal $V_{IN}$, and it is possible to make the phase difference between the input and the output signal constant regardless of the attenuation quantity.

While in this second embodiment, six switches $SW_0$, $SW_1$, $SW_2$, $SW_3$, $SW_4$, and $SW_5$ and six resistors $R_1$, $R_2$, $R_3$, $R_4$, and $R_5$ are provided, these elements may be provided in any number equal to the number of the resistors connected between the input terminal and ground and the same effects are also obtained as in the second embodiment.

Embodiment 3.

While in the above-described first and second embodiments, the attenuators produce a constant phase difference between the input and the output independent of the attenuation quantity, it is also possible to construct an attenuator so that the phase difference is actively varied to some degree so as to finely adjust the phase difference.

Figure 4:
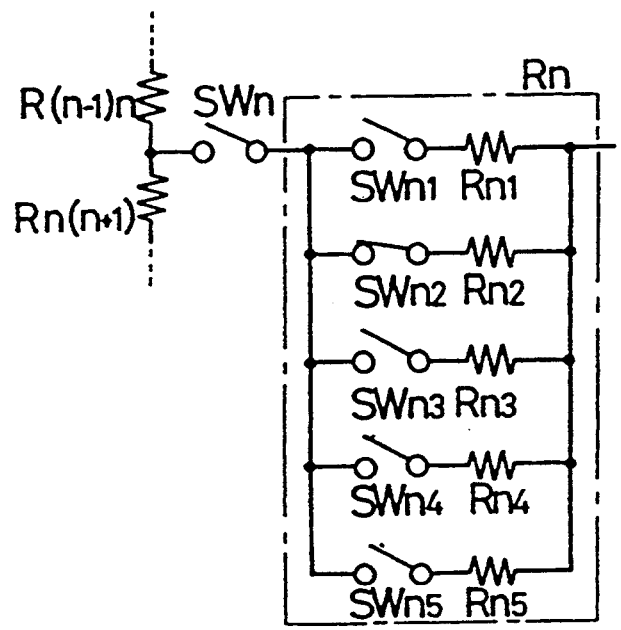
FIG. 4 is a diagram illustrating an attenuator according to a third embodiment of the present invention in which the phase difference can be varied.

FIG. 4 illustrates a circuit diagram of an attenuator according to a third embodiment of the present invention having such a construction. In FIG. 4, an element corresponding to the resistor $R_n$ in FIG. 1($a$) which is connected in series to the n-th switch $SW_n$, includes five resistors $R_{n1}$, $R_{n2}$, $R_{n3}$, $R_{n4}$, $R_{n5}$, one end of each of which is connected to the output end of the switch $SW_n$ via respective switches $SW_{n1}$, $SW_{n2}$, $SW_{n3}$, $SW_{n4}$, $SW_{n5}$. The other ends of the resistors $R_{n1}$, $R_{n2}$, $R_{n3}$, $R_{n4}$, $R_{n5}$ are commonly connected to provide a connection node, which is connected to the output terminal of the attenuator, so as to enable to vary the resistance value.

In this attenuator of the third embodiment, because it is possible to select among the five resistance values $R_{n1}$, $R_{n2}$, $R_{n3}$, $R_{n4}$, $R_{n5}$ as the resistance value of the resistor $R_n$ by closing only one among the five switches $SW_{n1}$, $SW_{n2}$, $SW_{n3}$, $SW_{n4}$, $SW_{n5}$, the resistance value $R_n$ can be finely adjusted, and the phase difference can be positively varied to some degree.

While in this third embodiment, six switches $SW_0$, $SW_1$, $SW_2$, $SW_3$, $SW_4$, and $SW_5$ and six resistors $R_1$, $R_2$, $R_3$, $R_4$, and $R_5$ are provided, these elements may be provided in any number equal to the number of resistors corrected in series between the input terminal and ground, and the same effects are also obtained as in the third embodiment.

Embodiment 4.

While in the above-described third embodiment, only one resistor is selected among the five resistors as a resistor giving a phase difference, this resistor that gives a phase difference may be variable, dependent on how many resistors are connected in series to each other.

Figure 5:
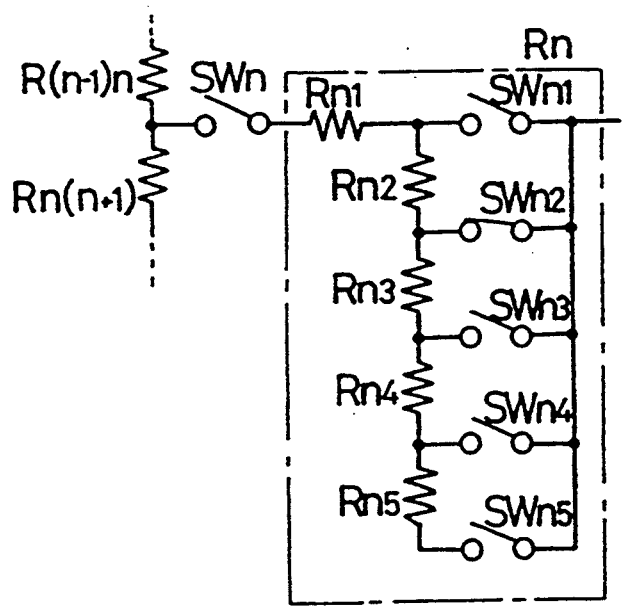
FIG. 5 is a diagram illustrating an attenuator according to a fourth embodiment of the present invention which is an alternative of the third embodiment of FIG. 4.

FIG. 5 illustrates an attenuator according to a fourth embodiment having such a construction.

In this FIG. 5, an element corresponding to the resistor $R_n$ in FIG. 1 which is connected in series to the n-th switch $SW_n$, includes five resistors $R_{n1}$, $R_{n2}$, $R_{n3}$, $R_{n4}$, $R_{n5}$ which are connected in series to each other. One terminal of the resistor $R_{n1}$ is connected to the other end of the switch $SW_n$. Five switches $SW_1$, $SW_{n2}$, $SW_{n3}$, $SW_{n4}$, $SW_{n5}$ are respectively connected to the four connection nodes of adjacent serially connected resistors. Switch $SW_{n5}$ is connected to the resistor $R_{n5}$, respectively, and the other ends of the switches $SW_{n1}$, $SW_{n2}$, $SW_{n3}$, $SW_{n4}$, $SW_{n5}$ are commonly connected to each other to provide one connection node, which is connected to the output terminal of the attenuator.

In this fourth embodiment, it is possible to select a resistance value of the resistor $R_n$ among five resistance values of $R_{n1}$, $R_{n1}+R_{n2}$, $R_{n1}+R_{n2}+R_{n3}$, $R_{n1}+R_{n2}+R_{n3}+R_{n4}$, $R_{n1}+R_{n2}+R_{n3}+R_{n4}+R_{n5}$, and thus, the resistance value $R_N$ can be finely adjusted and therefore the phase difference can be positively finely adjusted to some degree.

While in this fourth embodiment, six switches $SW_0$, $SW_1$, $SW_2$, $SW_3$, $SW_4$, and $SW_5$ and five resistors $R_1$, $R_2$, $R_3$, $R_4$, and $R_5$ are provided, respectively, these elements may be provided in any number equal to the number of the resistors connected in series between the input terminal and ground and the same effects are also obtained as in the fourth embodiment.

According to a first aspect of the present invention, a plurality of first resistors are connected in series to each other between an input node to which an input signal to be attenuated is applied and a predetermined voltage node, a plurality of voltage output nodes are provided, one connected to the input node and others to the connection nodes of the adjacent resistors, respectively. Input nodes of a plurality of switches, only one of which is selectively closed, are respectively connected to the plurality of voltage output nodes, a plurality of second resistors are connected to the output terminals of the plurality of switches, and the other ends of the second resistors are commonly connected to provide an output node for outputting an attenuated output signal, and a load capacitance is connected between the output node and the predetermined voltage node. By this construction, to the phase difference that arises in accordance with the attenuation quantity, a phase amount that is determined dependent on the phase difference is added by the second resistor, the resistance of which is determined so that the phase shift amount of the output signal against the input signal is determined by the voltage dividing ratio of the first resistors and the capacitance value of the load capacitance, and does not depend on the attenuation quantity selected by the switch, whereby even when any output signal of having any attenuation quantity is selected, an attenuated output of a constant phase difference can be easily obtained without deteriorating the precision of the voltage division in the attenuation.

According to a second aspect of the present invention, a plurality of first resistors are connected in series to each other between an input node to which an input signal to be attenuated is input and a predetermined voltage node, one of a plurality of voltage output nodes is connected to the input node and the other output nodes are connected to connection nodes between adjacent first resistors, one end of each of the second resistors is connected to one of the plurality of voltage output nodes, respectively, the plurality of output nodes outputting attenuated output signals to the other ends of the plurality of second resistors, respectively, and a plurality of load capacitances are connected between the plurality of output nodes and the predetermined voltage node, respectively. By this construction, to the phase difference that arises in accordance with the attenuation quantity, a required phase amount that is dependent on the phase difference is added by the second resistor, the resistance of which is determined so that the phase shift amount of the output signal against the input signal, that is determined by the voltage dividing ratio of the first resistors and the capacitance value of the load capacitance, and does not depend on the attenuation quantity, whereby a plurality of attenuated outputs having a constant phase difference can be obtained at the same time easily without deteriorating the precision of the voltage division in the attenuation.

According to a third aspect of the present invention, the resistance values of the second resistors are made variable by a plurality of resistors and switches and therefore, the phase difference between the input and the output can be can finely adjusted by positively varying the phase difference between the input and the output to some degree.

What is claimed is:

1. An attenuator comprising:
   an input node to which an input signal to be attenuated is input;
   a plurality of first resistors connected at connection nodes in series between said input node as a first of said connection nodes and a second node;
   a plurality of voltage output nodes including a first voltage output node coupled to said input node and other voltage output nodes respectively coupled to respective connection nodes of said plurality of first resistors;
   a plurality of switches, each switch being coupled to a respective voltage output node and a respective connection node;
   a plurality of second resistors, each second resistor being connected in series to one of said switches between a connection node and an output node from which an attenuated output signal is taken, one end of each of said plurality of series connections of said switches and second resistors being commonly connected at an output node; and
   a load capacitance connected between said output node and said second node wherein said respective second resistors have resistances determined so that an output signal at said output node has a phase relative to an input signal that is determined by a dividing ratio of said first resistors and said load capacitance independent of signal attenuation selected by closing one of said switches.

2. The attenuator of claim 1 wherein at least one of said second resistors includes a plurality of auxiliary resistors and corresponding auxiliary switches serially connected to respective auxiliary resistors, said serial connections of said auxiliary resistors and switches being connected in parallel for varying the resistance of said at least one second resistor by closing one of said auxiliary switches.

3. The attenuator of claim 1 wherein at least one of said second resistors comprises n auxiliary resistors connected in series to each other at connection nodes and n auxiliary switches, each auxiliary switch having first and second terminals, said first terminals being commonly connected and said second terminals being connected to respective common connection nodes of said auxiliary resistors for varying the resistance of said at least one second resistor by closing one of said auxiliary switches.

4. An attenuator comprising:
   an input node to which an input signal to be attenuated is input;
   a plurality of first resistors connected at connection nodes in series between said input node as a first of said connection nodes and a second node;
   a plurality of voltage output nodes including a first voltage output node coupled to said input node and other voltage output nodes respectively coupled to respective connection nodes of said plurality of first resistors;
   a plurality of second resistors, each second resistor being respectively connected to a corresponding one of said connection nodes and voltage output nodes; and
   a plurality of load capacitances respectively connected between a corresponding output node and said second node wherein said respective second resistors have resistances determined so that an output signal at an output node has a phase relative to an input signal that is determined by a dividing ratio of said first resistors and said load capacitances is independent of signal attenuation at a selected output node.

5. The attenuator of claim 4 wherein at least one of said second resistors includes a plurality of auxiliary resistors and corresponding auxiliary switches serially connected to respective auxiliary resistors, said serial connections of said auxiliary resistors and switches being connected in parallel for varying the resistance of said at least one second resistor by closing one of said auxiliary switches.

6. The attenuator of claim 4 wherein at least one of said second resistors comprises n auxiliary resistors connected in series to each other at connection nodes and n auxiliary switches, each auxiliary switch having first and second terminals, said first terminals being commonly connected and said second terminals being connected to respective common connection nodes of said auxiliary resistors for varying the resistance of said at least one second resistor by closing one of said auxiliary switches.

* * * * *